(12) United States Patent
Huh et al.

(10) Patent No.: US 9,153,714 B2
(45) Date of Patent: Oct. 6, 2015

(54) PHOTOELECTRIC CONVERSION DEVICE

(71) Applicant: Electronics and Telecommunications Research Institute, Daejeon (KR)

(72) Inventors: Chul Huh, Daejeon (KR); Sang Hyeob Kim, Daejeon (KR); Byoung Jun Park, Iksan (KR); Eun Hye Jang, Sejong (KR); Myung Ae Chung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 106 days.

(21) Appl. No.: 14/021,927

(22) Filed: Sep. 9, 2013

(65) Prior Publication Data

US 2014/0151833 A1     Jun. 5, 2014

(30) Foreign Application Priority Data

Dec. 5, 2012  (KR) .......................... 10-2012-0140368

(51) Int. Cl.
*H01L 31/0232* (2014.01)
*H01L 31/0224* (2006.01)
*H01L 31/103* (2006.01)

(52) U.S. Cl.
CPC .. *H01L 31/02327* (2013.01); *H01L 31/022466* (2013.01); *H01L 31/103* (2013.01)

(58) Field of Classification Search
CPC ................. H01L 31/02327; H01L 31/022466; H01L 31/103
USPC .................................. 257/257, 290, 431, 432
See application file for complete search history.

(56) References Cited

U.S. PATENT DOCUMENTS 7,781,778 B2 * 8/2010 Moon et al. ...................... 257/79
2011/0139223 A1    6/2011 Park et al.

* cited by examiner

*Primary Examiner* — Thien F Tran

(57) ABSTRACT

A photoelectric conversion device according to an exemplary embodiment includes a first substrate, a photoelectric conversion layer disposed above the first substrate, a second substrate which is different from the first substrate and disposed on the photoelectric conversion layer, and a nano pillar layer disposed above the second substrate in which the nano pillar layer includes a plurality of nano pillars which is spaced apart from each other, so as to easily absorb the light.

11 Claims, 4 Drawing Sheets

PHOTOELECTRIC CONVERSION DEVICE

CROSS-REFERENCE TO RELATED APPLICATIONS

This application claims priority to and the benefit of Korean Patent Application No. 10-2012-0140368 filed in the Korean Intellectual Property Office on Dec. 5, 2012, the entire contents of which are incorporated herein by reference.

TECHNICAL FIELD

Embodiments relate to a photoelectric conversion device, and more specifically, to a photoelectric conversion device which easily absorbs light.

BACKGROUND ART

Currently, a technology for obtaining visual information among five senses of a human is actively being developed. An essential technology for developing such a digital image implementing technology is an image sensor technology. The image sensor is a semiconductor device which converts an optical signal into an electrical signal. The image sensor may be classified into a CCD (charge coupled device) image sensor based on a silicon semiconductor and a CMOS (complementary metal oxide semiconductor) image sensor. Generally, the CMOS image sensor has lower unit cost of production and lower power consumption, easier integration of a periphery circuit on the same chip and a higher processing speed than those of the CCD image sensor. Therefore, in recent years, the CMOS image sensor has dominated the market while replacing the CCD image sensor.

The CMOS image sensor uses a silicon p-n junction photoelectric conversion device (photodiode) as a photo detection method. The CMOS image sensor is manufactured by integrating large number of silicon p-n junction photoelectric conversion device unit pixels in an array in order to obtain an image. Recently, in order to obtain an image resolution and a high quality image of the CMOS image sensor, a size of a unit pixel, that is, a size of a silicon p-n photoelectric conversion device unit pixel is reduced so that a technology development with a high integrated pixel structure is performed.

SUMMARY OF THE INVENTION

The present invention has been made in an effort to provide a photoelectric conversion device which easily absorbs light.

An exemplary embodiment of the present invention provides a photoelectric conversion device including: a first substrate, a photoelectric conversion layer disposed above the first substrate, a second substrate which is different from the first substrate and disposed on the photoelectric conversion layer, and a nano pillar layer disposed above the second substrate in which the nano pillar layer includes a plurality of nano pillars which is spaced apart from each other.

The photoelectric conversion device according to the exemplary embodiment forms a nano pillar layer including a plurality of nano pillars on a photoelectric conversion layer so that incident light which enters the nano pillar layer is refracted, reflected, and transmitted to enter the photoelectric conversion layer, thereby improving an optical absorption efficiency in the photoelectric conversion layer.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
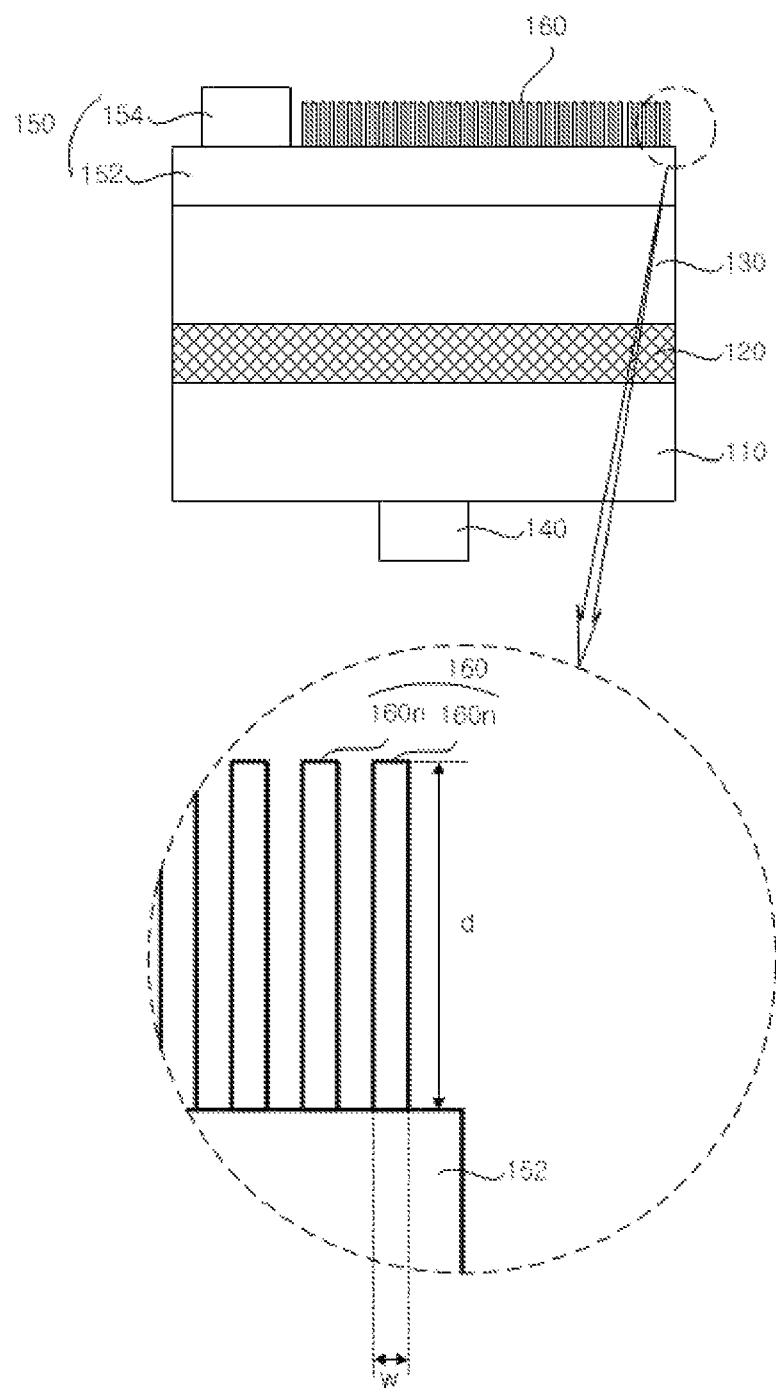
FIG. 1 is a cross-sectional view illustrating a photoelectric conversion device according to an exemplary embodiment.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

In the description of components of an exemplary embodiment, a component having the same name may be denoted by a different reference numeral in some of the drawings but may be denoted by the same reference numeral even in different drawings. However, even in this case, it does not mean that the component has different functions depending on the exemplary embodiment or the components have the same function in the different exemplary embodiments, and the function of each of the components should be determined based on the description of the components in the corresponding exemplary embodiment.

In the description of the exemplary embodiment, if it is considered that specific description of related known configuration or function may cloud the gist of the present invention, the detailed description thereof will be omitted.

In the description of the components of the exemplary embodiment, a terminology such as a first, a second, A, B, (a), and (b) may be used. The terminology is used to distinguish a component from the other components but a nature or an order of the component is not limited by the terminology. If it is described that a component is "connected" or "coupled" or "accessed" to the other component, it is understood that the component is directly connected or coupled to the other component but another component may be "connected" or "coupled" or "accessed" between the components.

Hereinafter, portions required to understand an operation and an effect of a photoelectric conversion device according to the exemplary embodiment will be mainly described in detail.

FIG. 1 is a cross-sectional view illustrating a photoelectric conversion device according to an exemplary embodiment.

Figure 2A:
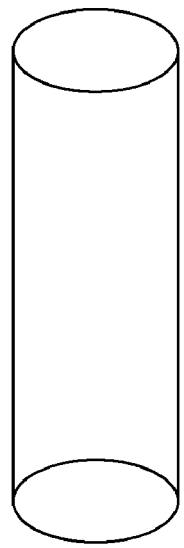
FIGS. 2A to 2C are a view illustrating various exemplary embodiments of a nano pillar included in a nano pillar layer illustrated in FIG. 1.
Figure 2B:
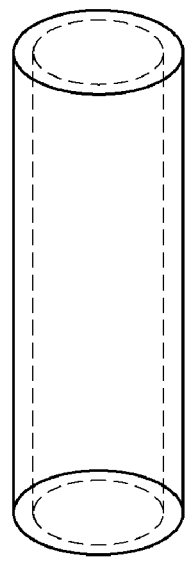
Figure 2C:
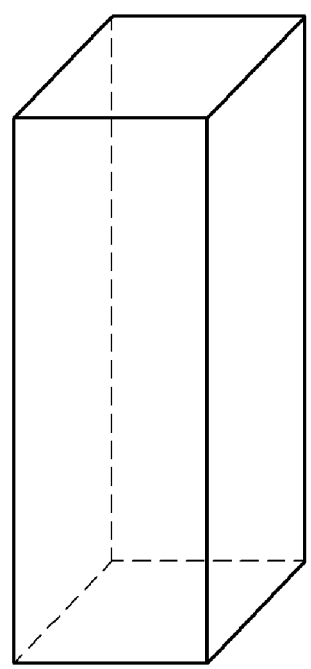

FIGS. 2A to 2C are a view illustrating various embodiments of a nano pillar included in a nano pillar layer illustrated in FIG. 1.

Referring to FIGS. 1 and 2A to 2C, the photoelectric conversion device includes a first substrate 110, a photoelectric conversion layer 120 disposed above the first substrate 110, a second substrate 130 which is different from the first substrate 110 and disposed on the photoelectric conversion layer 120, a first electrode 140 disposed below the first substrate 110, a second electrode 150 disposed on the second substrate 130, and a nano pillar layer 160 disposed on the second electrode 150.

The first and second substrates 110 and 130 may be formed of crystalline silicon or a compound semiconductor. If the substrates are crystalline silicon, a silicon wafer may be used.

In this case, the first substrate 110 may be a semiconductor substrate doped with a P type impurity and the second substrate 130 may be a semiconductor substrate doped with an N type impurity, but the present invention is not limited thereto.

Here, the P type impurity may be a III group element such as a boron B or aluminum Al and the N type impurity may be a V group element such as phosphorus P, but the impurity is not limited thereto. As the P type impurity and the N type impurity, other materials may be used depending on the type of semiconductor substrate.

The photoelectric conversion layer 120 is disposed between the first and second substrates 110 and 130 and may use a crystalline silicon (monocrystalline silicon, polycrystalline silicon, and microcrystalline silicon or amorphous silicon. Alternatively, a material containing the crystalline silicon or the amorphous silicon or a silicon material containing nitrogen or carbon may be used.

In the exemplary embodiment, the photoelectric conversion layer 120 may be formed of a silicon carbide based material including the silicon nano crystal, for example, SiC and SiCN, but the material is not limited thereto.

The photoelectric conversion layer 120 may be formed by using a material, which is different or has a different crystal status from the photoelectric conversion layer 120, using a PECVD method, a thermal CVD method, or a sputtering method. For example, a P type crystal silicon wafer may be used for the photoelectric conversion layer 120, an n type crystal silicon doped with N type phosphorous may be used for the second substrate 130, and a P type crystal silicon doped with P type boron or aluminum may be used for the first substrate 110. However, the materials are not limited thereto.

A thickness of the photoelectric conversion layer 120 may be 1 nm or thicker, but the thickness is not limited thereto.

The photoelectric conversion layer 120 may generate an electron and an electron hole depending on an absorptance of the incident light and transfer the electron and electron hole to the first and second electrodes 140 and 150 through the first and second substrates 110 and 130.

Here, the first and second electrodes 140 and 150 may be formed of a metal material such as gold Ag, silver Au, or aluminum Al, which have excellent electric conductivity and may be patterned to a stripe pattern or a mesh pattern, but the material and pattern are not limited thereto.

The second electrode 150 includes a transparent electrode 152 and a metal electrode 154 on the transparent electrode 152. The transparent electrode 152 is formed of a material having translucency and electric conductivity, and may be formed of at least one of, for example, ITO (indium tin oxide), $SnO_2$, $In_2O_3$, $Cd_2SnO_4$, and ZnO, but the material is not limited thereto.

That is, the transparent electrode 152 may allow the incident light to enter the photoelectric conversion layer 120 and has conductivity to transmit the electron generated in the photoelectric conversion layer 120 to the metal electrode 154.

The metal electrode 154 is introduced in order to lower the electric resistance and receives the electrons generated as a result of the photoelectric converting operation to function as a collecting wiring line to provide a current path at a low resistance.

That is, the second electrode 150 functions as a negative electrode of the photoelectric conversion device and has a high aperture ratio.

The incident light which enters through the second electrode 150 operates as an excitation source of a photosensitive dye, which is adhered onto the photoelectric conversion layer 120, so that lots of allowed light VL enters thereon to increase the photoelectric converting efficiency.

A passivation layer (not illustrated) may be further formed on a surface of the metal electrode 150 and the passivation layer prevents the damage on the electrode such as corrosion of the metal electrode 154 from occurring when the metal electrode 154 reacts with an electrolyte by being in contact with the electrolyte.

The passivation layer may be formed of a material which does not react with the electrolyte, for example, a curable resin material, but the material of the passivation layer is not limited thereto.

The nano pillar layer 160 may be formed on the second electrode 150 and in this exemplary embodiment, it is described that the nano pillar layer 160 is disposed on the transparent electrode 152.

The nano pillar layer 160 may include a plurality of nano pillars 160n formed of at least one of ITO, $SnO_2$, $In_2O_3$, $Cd_2SnO_4$, and ZnO and at least one of the plurality of nano pillars 160n may have different size and length from the another nano pillar, but is not limited thereto.

In the exemplary embodiment, it is described that the plurality of nano pillars 160n is formed to have a tilt angle of 90 degrees above the transparent electrode 152, but the nano pillars may be formed to have a tilt angle of 30 degrees to 90 degrees above the transparent electrode 152, and the present invention is not limited thereto.

In the exemplary embodiment, it is described that the plurality of nano pillars 160n has the same size, for example, the same width and length.

The plurality of nano pillars 160n may refract, reflect, and transmit the incident light so as to enter onto the photoelectric conversion layer 120.

Here, a width w or a diameter of the plurality of nano pillars 160n may be 1 nm to 1,000 nm, and a length d of the plurality of nano pillars 160n may be 1 nm to 1 mm.

That is, if the width w or the diameter is smaller than 1 nm, a function of refracting and reflecting the incident light may be very low. If the width w or the diameter is larger than 1,000 nm, a function of transmitting the incident light may be low.

If the length d is smaller than 1 nm, the manufacturing process efficiency is very low and efficiency for the function of refracting, reflecting, and transmitting the incident light is low. If the length d is larger than 1 nm, when the plurality of nano pillars 160n is formed, the nano pillars are highly likely to be broken.

Here, FIGS. 2A to 2C illustrate various shapes of the plurality of nano pillars 160n.

That is, the nano pillars 160n of FIGS. 2A and 2C have a circular cylinder shape and a polygonal shape, respectively, and the nano pillar 160n of FIG. 2B has a cylindrical rod shape.

The nano pillars 160n illustrated in FIG. 2 have a shape which may increase the efficiency of the light incident onto the photoelectric conversion layer 120 but may have any other shape.

The photoelectric conversion device described in the exemplary embodiment may form the nano pillar layer to refract, reflect, and transmit the incident light so as to enhance the efficiency of the light incident onto the photoelectric conversion layer.

Figure 3:
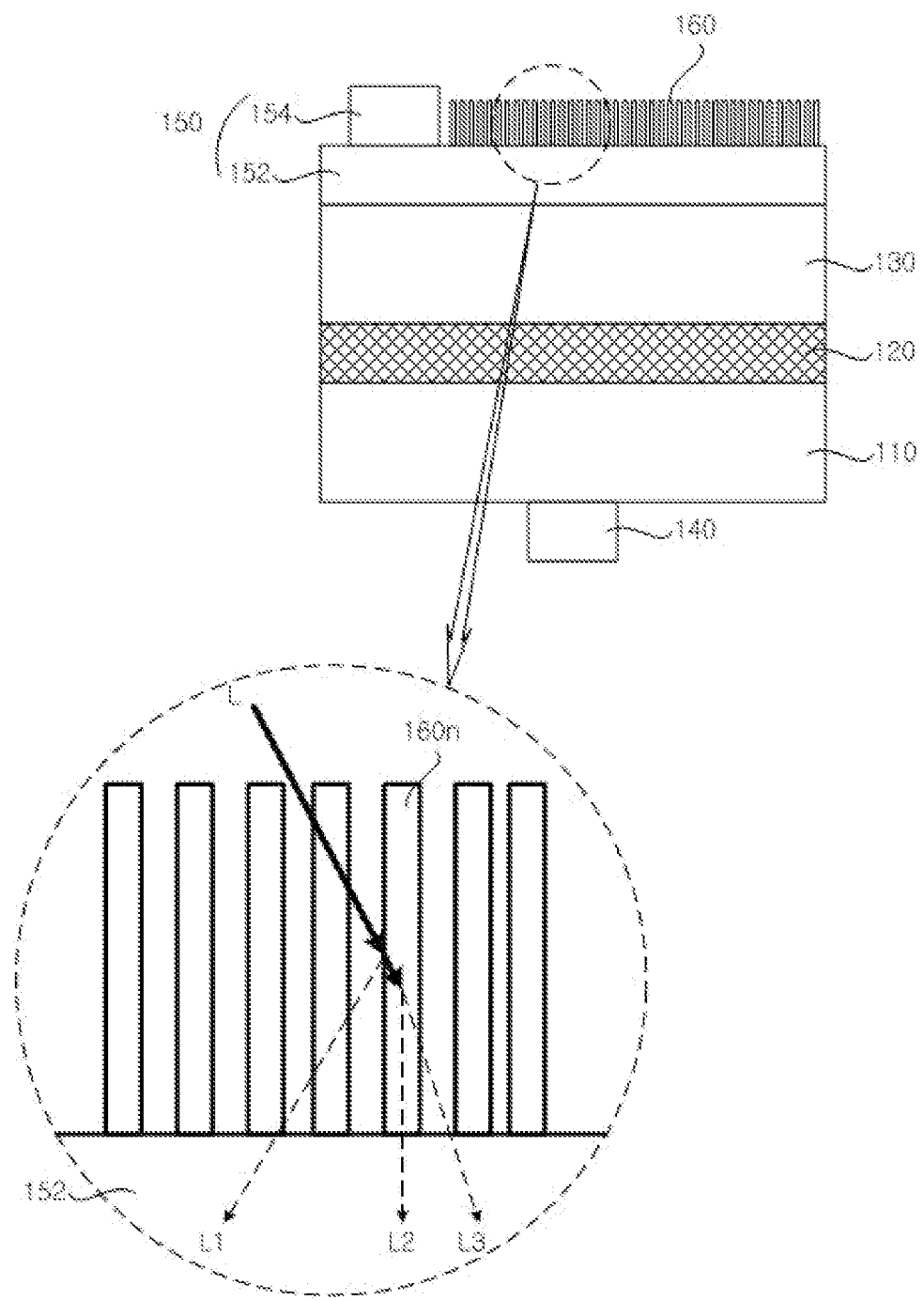
FIG. 3 is a cross-sectional view schematically illustrating an optical absorption path of the photoelectric conversion device according to the exemplary embodiment.

FIG. 3 is a cross-sectional view schematically illustrating an optical absorption path of the photoelectric conversion device according to the exemplary embodiment.

FIG. 3 illustrates the same configuration and structure as FIG. 1 and the description of the configuration will be omitted or briefly described.

Referring to FIG. 3, the nano pillars 160n of the photoelectric conversion device may allow at least one of reflected light L1 obtained by reflecting the incident light L, refracted light L2, and transmitted light L3 to enter the photoelectric conversion layer 120.

That is, when the incident light L enters the transparent electrode 152 with a predetermined tilt angle, the nano pillars 160n prevent the incident light L from being reflected to the outside without entering the photoelectric conversion layer 120 in accordance with a refractive index of air so as to enhance the efficiency of the light L1, L2, and L3, which enter the photoelectric conversion layer 120, with respect to the incident light L.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A photoelectric conversion device, comprising:
   a first substrate;
   a photoelectric conversion layer disposed above the first substrate;
   a second substrate which is different from the first substrate and disposed above the photoelectric conversion layer;
   a nano pillar layer disposed above the second substrate; and
   a second electrode disposed between the second substrate and the nano pillar layer, the second electrode including a transparent electrode and a metal electrode disposed on at least one of the transparent electrode and the photoelectric conversion layer,
   wherein the nano pillar layer includes a plurality of nano pillars which are spaced apart from each other.

2. The photoelectric conversion device of claim 1, wherein the first substrate is a P type semiconductor substrate.

3. The photoelectric conversion device of claim 1, wherein the second substrate is an N type semiconductor substrate.

4. The photoelectric conversion device of claim 1, further comprising:
   a first electrode disposed below the first substrate.

5. The photoelectric conversion device of claim 1, wherein the transparent electrode includes at least one of indium tin oxide (ITO), $SnO_2$, $In_2O_3$, $Cd_2SnO_4$, and ZnO.

6. The photoelectric conversion device of claim 1, wherein the nano pillar layer includes at least one of ITO, $SnO_2$, $In_2O_3$, $Cd_2SnO_4$, and ZnO.

7. The photoelectric conversion device of claim 1, wherein the nano pillar layer refracts, reflects, and transmits the incident light toward the photoelectric conversion layer.

8. The photoelectric conversion device of claim 1, wherein at least one of the plurality of nano pillars has at least one of a diameter and a length which is different from the others.

9. The photoelectric conversion device of claim 1, wherein a diameter of at least one of the plurality of nano pillars is 1 nm to 1,000 nm.

10. The photoelectric conversion device of claim 1, wherein a length of at least one of the plurality of nano pillars is 1 nm to 1 mm.

11. The photoelectric conversion device of claim 1, wherein the plurality of nano pillars has at least one of ellipse, rod, and tube shapes.

* * * * *